US007688232B2

(12) United States Patent
Lim et al.

(10) Patent No.: US 7,688,232 B2
(45) Date of Patent: Mar. 30, 2010

(54) OPTIMAL SELECTION OF COMPRESSION ENTRIES FOR COMPRESSING PROGRAM INSTRUCTIONS

(75) Inventors: Chu-Cheow Lim, Santa Clara, CA (US); Guei-Yuan Lueh, San Jose, CA (US); Bixia Zheng, Palo Alto, CA (US); Hong Jiang, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 282 days.

(21) Appl. No.: 11/691,795

(22) Filed: Mar. 27, 2007

(65) Prior Publication Data

US 2008/0244245 A1     Oct. 2, 2008

(51) Int. Cl.
*H03M 7/00* (2006.01)
(52) U.S. Cl. ............................. 341/50; 341/51; 341/106
(58) Field of Classification Search .................. 341/106, 341/50, 51
See application file for complete search history.

(56) References Cited

U.S. PATENT DOCUMENTS

| | | | | |
|---|---|---|---|---|
| 5,729,228 A | * | 3/1998 | Franaszek et al. | ........... 341/106 |
| 5,764,994 A | * | 6/1998 | Craft | ........................... 717/159 |
| 5,977,890 A | | 11/1999 | Rigoutsos et al. | |
| 6,125,201 A | * | 9/2000 | Zador | .......................... 382/166 |
| 6,275,921 B1 | | 8/2001 | Iwata et al. | |
| 6,317,867 B1 | | 11/2001 | Elnozahy | |

FOREIGN PATENT DOCUMENTS

WO     2007005237     1/2007

OTHER PUBLICATIONS

Korean Patent Office, International Search Report and Written Opinion for PCT/US2008/057859, 9 Pgs., Jul. 29, 2008.

\* cited by examiner

*Primary Examiner*—Jean B Jeanglaude
(74) *Attorney, Agent, or Firm*—Trop, Pruner & Hu, P.C.

(57) ABSTRACT

A method of compressing instructions in a program may include extracting unique bit patterns from the instructions in the program and constructing a linear programming formulation or an integer programming formulation from the unique bit patterns, the instructions, and/or the size of a memory storage. The linear programming formulation or the integer programming formulation may be solved to produce a solution. The method may include compressing at least some of the instructions based on the solution by storing at least some of the unique bit patterns in a memory and placing corresponding indices to the memory in new compressed instructions.

12 Claims, 4 Drawing Sheets

|  | Field X | Field Y | Field Z |
|---|---|---|---|
| Instruction 1 | Pattern1 | Pattern1 | Pattern1 |
| Instruction 2 | Pattern2 | Pattern2 | Pattern2 |
| Instruction 3 | Pattern1 | Pattern2 | Pattern3 |
| Instruction 4 | Pattern4 | Pattern1 | Pattern3 |

OPTIMAL SELECTION OF COMPRESSION ENTRIES FOR COMPRESSING PROGRAM INSTRUCTIONS

CROSS-REFERENCE TO RELATED APPLICATION

The present application is related to U.S. application Ser. No. 11/348,260, filed Dec. 29, 2006, entitled "Methods And Apparatuses For Compaction And/Or Decompaction," (hereinafter "the related application") the entire content of which is incorporated by reference herein.

BACKGROUND

Implementations of the claimed invention generally may relate to data compression, and in particular to compressing instructions in programs (or code) prior to execution of the programs.

Many processing systems execute instructions. The ability to generate, store, and/or access instructions that make up programs is thus desirable. In particular, it may be generally desirable to reduce program/code size for savings in storage and/or bandwidth. Some techniques have been proposed to compress data that is stored on cache (e.g., L2) at runtime. Compressing at runtime, however, may introduce hardware complexity as well as extra latencies for making policy decisions on whether data needs to be compressed.

Another technique that has been proposed is echo instruction, which may reduce program/code size by replacing common/similar instruction sequence with echo instructions. This technique, however, focuses on instruction-level information in searching for common/similar instruction sequence, and thus ignores any useful information within instructions.

Such schemes to reduce program/code size, however, may be computationally intensive and/or may result in less than optimal compression for a particular program.

BRIEF DESCRIPTION OF THE DRAWINGS

The accompanying drawings, which are incorporated in and constitute a part of this specification, illustrate one or more implementations consistent with the principles of the invention and, together with the description, explain such implementations. The drawings are not necessarily to scale, the emphasis instead being placed upon illustrating the principles of the invention. In the drawings.

FIG. 4 illustrates an example instruction set to demonstrate mapping of bit patterns to variables.

DETAILED DESCRIPTION

The following details description refers to the accompanying drawings. The same reference numbers may be used in different drawings to identify the same or similar elements. In the following descriptions, for purposes of explanation and not limitation, specific details are set forth such as particular structures, architectures, interfaces, techniques, etc. in order to provide a thorough understanding of the various aspects of the claimed invention. However, it will be apparent to those skilled in the art having the benefit of the present disclosure that the various aspects of the invention claimed may be practiced in other examples that depart from these specific details. In certain instances, descriptions of well known devices, circuits, and methods are omitted so as not to obscure the description of the present invention with unnecessary detail.

In some implementations, a first processing system may be used in generating at least partially compacted instructions (or programs made of such instructions) for a second processing system to execute.

Figure 1:
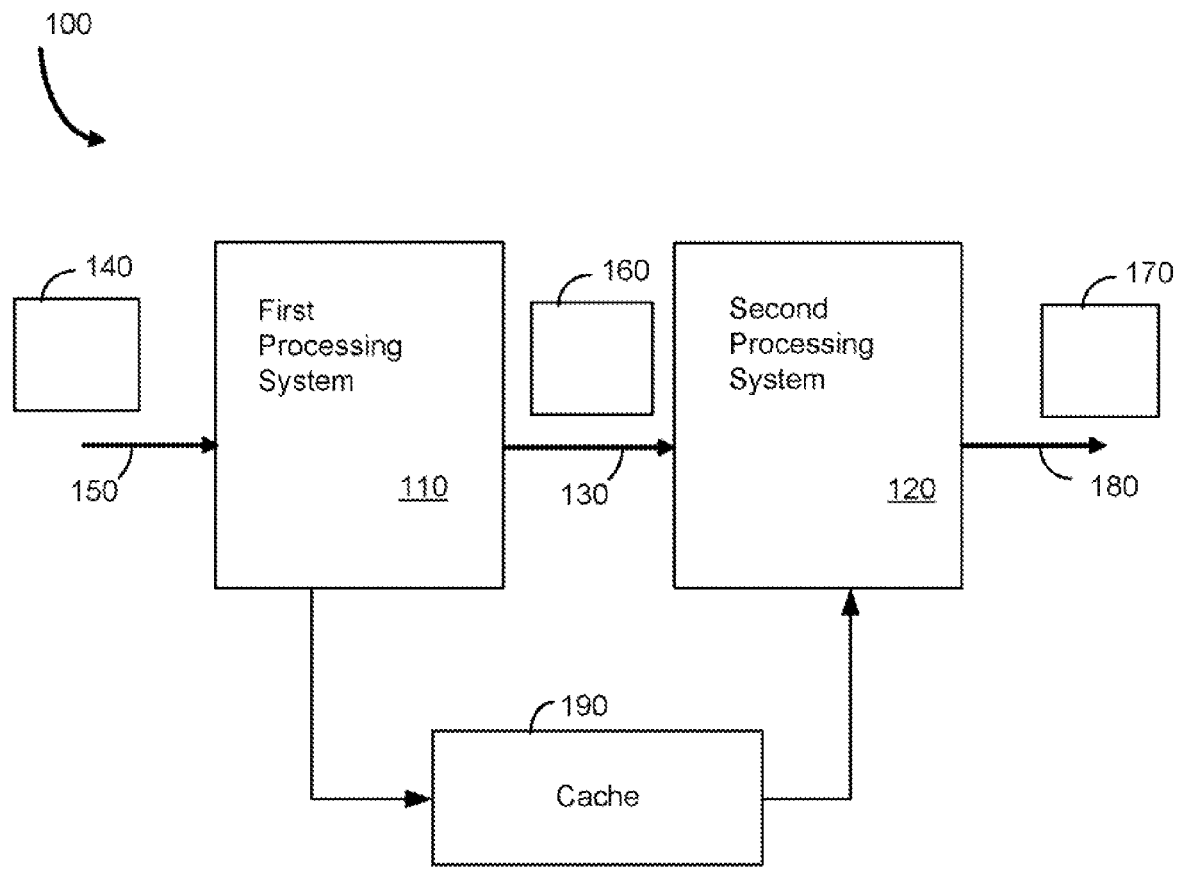
FIG. 1 shows a block diagram of a system having first and second processing systems.

FIG. 1 is a block diagram of a system 100 according to some implementations. Referring to FIG. 1, the system 100 includes a first processing system 110 and a second processing system 120. The first processing system 110 and the second processing system 120 may be coupled to one another, e.g., via a first communication link 130. System 100 may also include one or more indexed caches 190 for storing bit patterns generated by first processing system 110 during instruction and/or program compacting, as will be explained in greater detail below.

According to some implementations, the first processing system 110 is used in generating instructions for the second processing system 120. In the regard, in some implementations, the system 100 may receive an input or first data structure indicated at 140. The first data structure 140 may be received through a second communication link 150 and may include, but is not limited to, a program including a first number of instructions, which may include instructions in a first language, e.g., a high level language or an assembly language. In some implementations, these instructions in the first language may be 128 bit instructions, although the invention is not limited thereto.

The first data structure 140 may be supplied to an input of the first processing system 110, which may include a compiler and/or assembler that compiles and/or assembles one or more parts of the first data structure 140 in accordance with one or more requirements associated with the second processing system 120. An output of the first processing system 110 may supply a second data structure indicated at 160. The second data structure 160 may include, but is not limited to, a program including a second number of instructions, which may include instructions in a second language, e.g., a machine or binary language. In some implementations, the second language may be the same at the first language, except that it may contain 64 bit instructions. In some implementations, some or all of instructions in the second language may be 64 bit instructions, although the instructions in the second language may also include some 128 bit instructions. Of course, the invention is not limited to instructions of any particular length(s), but at least some of the instructions in the second language may be shorter than, or compacted from, the instructions in the first language.

Figure 2:
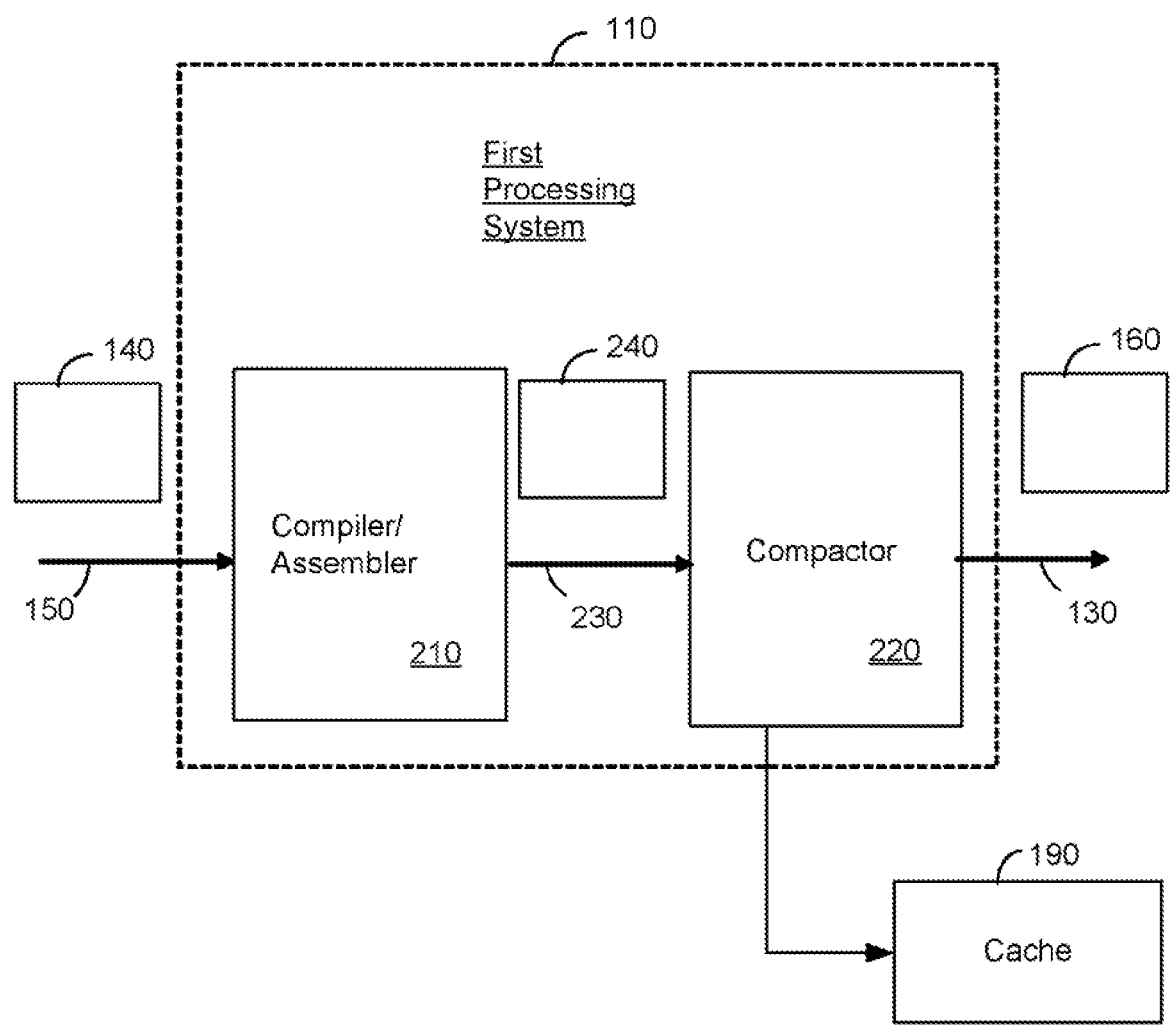
FIG. 2 shows a block diagram of the first processing system of FIG. 1.

FIG. 2 is a block diagram of one implementation the first processing system 110. Referring to FIG. 2, in some implementations, the first processing system 110 includes a compiler and/or assembler 210, which may not be present in some implementations, and a compactor 220. The compiler and/or assembler 210 and the compactor 220 may be coupled to one another, for example, via a communication link 230. Although shown for ease of description as two separate elements, in some implementations the compactor 220 may be a functional portion of the compiler and/or assembler 110.

In some implementations, the first processing system 110 may receive the first data structure 140 through the communication link 150. As stated above, the first data structure 140 may include, but is not limited to, a first plurality of instructions, which may include instructions in a first language, e.g., a high level language or an assembly language.

The first data structure 140 may be supplied to an input of the compiler and/or assembler 210. The compiler and/or assembler 210 includes a compiler, an assembler, and/or a combination thereof, that compilers and/or assembles one or more parts of the first data structure 140 in accordance with one or more requirements associated with the second processing system 120.

The compiler and/or assembler 210 may generate a data structure indicated at 240. The data structure 240 may include, but is not limited to, a plurality of instructions, which may include instructions in a second language, e.g., a binary or machine language. In some implementations, the second language may be the same as the first language, except that it may contain 64 bit instructions. In some implementations, the plurality of instructions may be a plurality of machine code instructions to be executed by an execution engine of the second processing system 120. In some implementations, the plurality of instructions may include more than one type of instruction.

The data structure 240 may be supplied to an input of the compactor 220, which may process each instruction in the data structure 240 to determine whether such instruction can be replaced by a compact instruction for the second processing system 120. If the instruction can be replaced, the compactor 220 may generate the compact instruction to replace such instruction. In some implementations, the compactor 220 generates the compact instruction based at least in part of the instruction to be replaced. In some implementations, the compact instruction includes a field indicating that the compact instruction is a compact instruction.

In accordance with some implementations, the compactor 220 may replace the instruction with the compact instruction. In the regard, the plurality of instructions may represent a sequence of instructions. The instruction may be removed from its position in the sequence and the compact instruction may be inserted at such position in the sequence such that the position of the compact instruction in the sequence is the same as the position of the instruction replaced thereby, prior to removal of such instruction from the sequence.

As will be explained in greater detail below, compactor 220 may compact some instructions in data structure 240 by storing commonly appearing bit patterns in cache(s) 190. Compactor 220 may compact the instruction(s) by using an index to the bit pattern's location in cache(s) 190, instead of the bit patterns themselves, in the instructions in second data structure 160.

Returning to FIG. 1, the second data structure 160 may be supplied through the first communication link 130 to an input of the second processing system 120. The second processing system may execute one or more of the second plurality of instructions and may generate data indicated at 170. In some implementations, the second processing system 120 may expand and compacted instructions (e.g., 64 bit instructions) in the second data structure 160 before execution by accessing the appropriate bit patterns in cache(s) 190 via index value(s) in the compacted instructions. Instructions in the second data structure 160 that are not compacted (e.g., 128 bit instructions) may be processed by second processing system 120 without using cache(s) 190.

The second processing system 120 may be coupled to one or more external devices (not shown) through one or more communication links, e.g., a third communication link 180, and may supply some or all of the data 170 to one or more of such external devices through one or more of such communication links.

As explained above, one or more portions (e.g., bit patterns) of the instructions for the second processing system 120 may be stored in one or more memory units (e.g., cache(s) 190). In this regard, cache(s) 190 may include a single memory unit, or multiple memory units. In certain cases (e.g., for relatively small programs) cache(s) 190 may have sufficient space to store all bit patterns necessary to fully compress the instructions in first data structure 140 (or data structure 240). In other cases (e.g., for relatively large programs) cache (s) 190 may not have sufficient space to store all bit patters necessary to fully compress the instructions in first data structure 140 (or data structure 240). In such implementations, it may be desirable to optimize the compression ratio for the instructions in data structure(s) 140 or 240 to obtain the largest amount of compression given the size constraints of cache(s) 190. The description will now turn to such a code optimization scheme.

As alluded to above, and as explained in the related application, instructions in a program may be compressed by extracting common bit patterns out of, for example, 128-bit instructions. The indexed cache(s) 190 may hold these common bit patterns and any other information needed for the new, compact instructions (e.g., 64-bit instructions). The compiler or assembler 210 may identify what bit patterns are to be stored in the indexed cache(s) 190 and may also determine what instructions can be replaced with the new compact instructions. Depending on the size of the program containing the instructions and/or the size of cache(s) 190, certain instructions may not be able to be compressed due to limited space in cache(s) 190. In such cases, it may desirable for compactor 220 (or compiler 210 if the compacting function is part of the compiler module) to optimally compress (e.g., compress as much as possible) the program.

In greater detail, each instruction in a program may be partitioned into several fields, as conceptually illustrated, for example, in FIG. 4. It should be noted, however, that in some implementations some parts of an instruction may not be part of any field. Based on experiments that have been performed, most programs are likely to contain a number of common repeated bit patterns (M, an integer greater or equal to one) for some of those fields. It should also be noted that each of the M fields need not be of the same size (i.e., each field may contain a number of bits which is totally different from all other fields). If all M bit patterns of an instruction are all replaced by index values which are used to index into cache(s) 190 that store the original bit patterns, the instructions can then be replaced using a more compact instruction, resulting in more compact program. Because cache(s) 190 have limited number of entries, not all the bit patterns found in a program's instructions can be stored in the tables and be replaced by index values.

Figure 3:
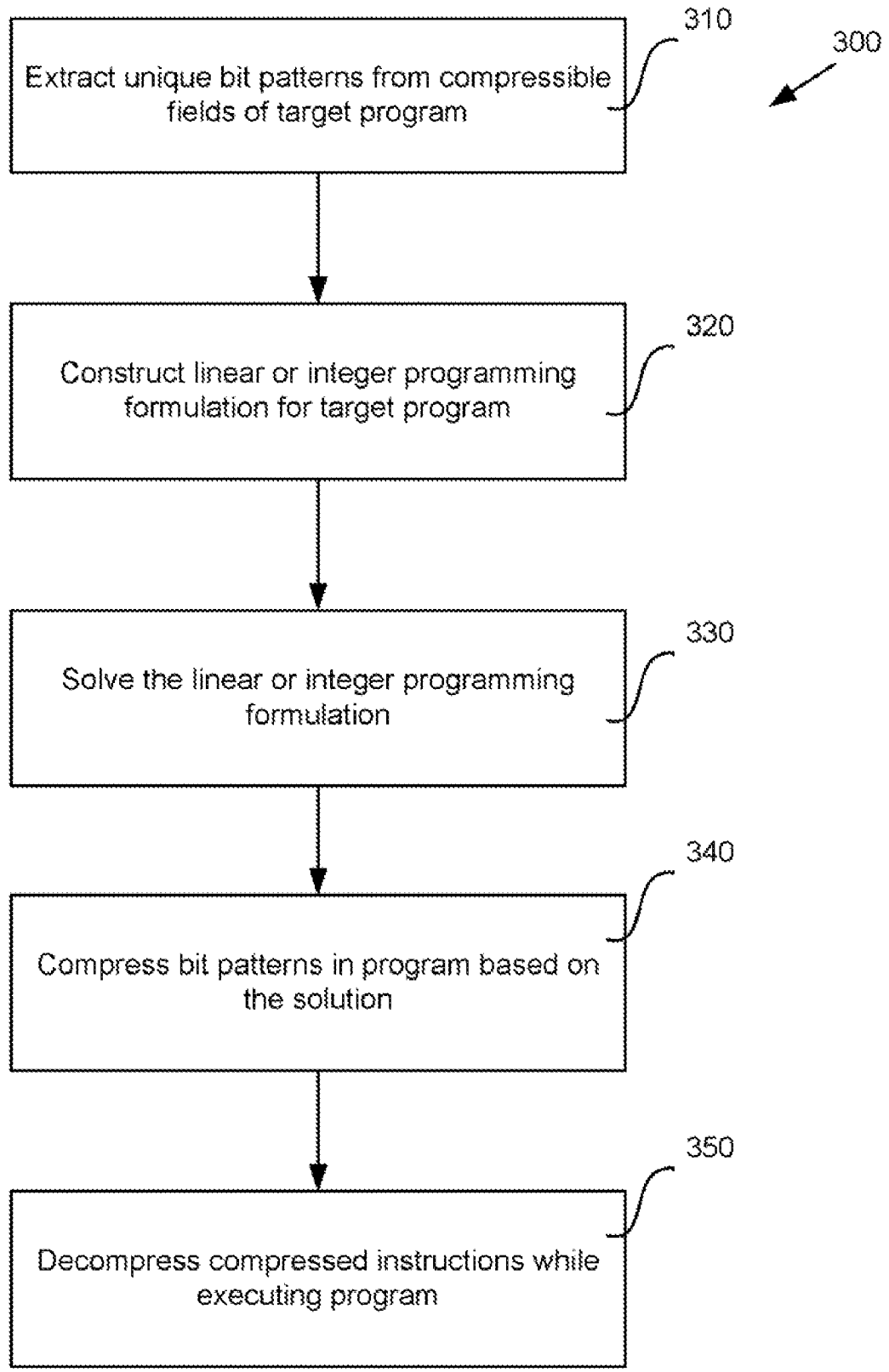
FIG. 3 illustrates a method of optimally compressing bit patterns in a program.

The method 300 in FIG. 3 describes a scheme for selecting the bit patterns to be stored in cache(s) 190 that will result in an optimal code compaction ratio (e.g., the lowest ratio of the size of compacted data structure 160 that is output by compactor 220 to the size of data structure 240 (or data structure 140) that is input to compactor 220). Although method 300 may be explained with regard to FIGS. 1, 2, and 4, the scheme therein is not limited to the particulars shown in these figures. Method 300 may start from instructions that have been placed into machine or binary format (e.g., by compiler 210 compiling them) from which patterns of bits may be identified.

Method 300 may begin with compactor 220 extracting unique bit patterns from compressible fields in the instructions of a target program [act 310]. Any of a number of known bit identification schemes may be used in act 310 to determine the number of unique bit patterns within the instructions. As explained with regard to act 320, these unique bit patterns may be mapped to variables in a integer or linear programmers formulation.

After identifying the set of bit patterns, compactor 220 may construct an integer programming or linear integer programming representation of the target program's optimal compaction [act 320]. Such an integer programming or linear integer programming representation may be constructed automatically by compactor 220 from the unique bit patterns extracted in act 310 according the following principles, examples, and generalizations.

There may be N tables (N>=1) cache(s) 190 to store the compressed bit patterns, and there may be M (M>=1, M>=N) fields from which to select the bit patterns to insert into the table. As illustrated in FIG. 4, for example, each instruction may include a number of fields. For example, two possible scenarios are when all M fields share a single (N=1) table, or each field has it own table (M=N). In either scenario, each field has a dedicated table from which we retrieve the compressed bit pattern, if the instruction is compressed. The scheme in act 320 may use a many-to-one mapping from the compressible fields to the tables.

The $i^{th}$ table may be shared by $M_i$ fields. For the $i^{th}$ table, there may be a set of variables. Each variables corresponds to a unique bit pattern appearing in the $M_i$ field. The number of variables thus corresponds to the total number of unique bit patterns found among the $M_i$ fields.

Act 320 may use one of two (or more) schemes of constructing the optimal code compaction formulation: (a) as an integer programming problem, and (b) as a linear integer programming. Any algorithm, to solve either class of problem can be then applied in act 330 to compute the optimal code compaction. Although these two schemes will be described, it should be noted that any multivariate optimization scheme may be utilized in act 320 to set up a formulation to be solved for optimal program compaction.

(A) Integer Programming

Two specific examples (i.e., M=N and N=1) will be presented for each scheme to give an intuitive idea for implementing act 320. Then the generalization of these two examples will be presented. FIG. 4 shows an example program 410 (which is a specific instance of input data structure 240 or 140) with four instructions, each with three fields that the following examples will formulate for compression, and their bit patterns. Other fields that are not candidates for compression are not illustrated for ease of description, although such may also be present in a program. The fields are assumed to be all of the same size in the example for ease of description, but the generalization to be presented later does not need such this assumption.

M=N Example:

If each field has its own table, X, Y, and Z may be defined as the sets of variables, one for each table. Field X, Y, and Z has 3, 2, and 3 unique bit patterns respectively. Thus, there are 3 variables for table X ($x_1$, $x_2$, $x_3$), 2 variables for table Y ($y_1$, $y_2$) and 3 variables for table Z ($z_1$, $z_2$, $z_3$). An alternative view is that there are 3, 2 and 3 candidate bit patterns to be stored into tables X, Y, and Z. Note that in this scenario, even though Instruction 1's fields all have the same bit pattern, there are 3 variables, one for each table. Tables X, Y, Z are further defined to have $T_x$, $T_y$, $T_z$ entries, respectively.

Each variable is assigned a value of 1 if and only if the bit pattern is compressed (i.e. it gets an entry in the corresponding table); otherwise it gets a value 0. An instruction is compressed if and only if all its compressible fields are compressed (i.e. actually replaced by indices into the table). An instruction is assigned a value 1 if it is compressed and it is assigned a value of 0 otherwise.

To construct this formulation, each instruction is represented by a product of all the variables which correspond to the bit patterns its fields. In this example, the products are $x_1 y_1 z_1$, $x_2 y_2 z_2$, $x_1 y_2 z_3$, $x_3 y_1 z_3$ for Instructions 1 to 4, respectively.

It is desirable to maximize code compaction (i.e., the number of compressed instructions). The integer programming formulation for the M=N case is then to find the values for $x_i$, $y_i$, $z_i$ that maximize the sum of the products:

Maximize: $x_1 y_1 z_1 + x_2 y_2 z_2 + x_1 y_2 z_3 + x_3 y_1 z_3$

Subject to the constraints:

$x_i$ (i=1 ... 3)=0 or 1

$y_i$ (i=1,2)=0 or 1

$z_i$ (i=1 ... 3)=0 or 1

$\Sigma_{i=1...3} x_i \leq T_x$ $\Sigma_{i=1...2} y_i \leq T_y$ $\Sigma_{i=1...3} z_i \leq T_z$ (i.e., the number of compressed bit patterns must fit into each corresponding table.)

N=1 Example:

If all fields share a single table, only one set of variables (e.g., the set of variables X) is needed for an integer programming formulation. Among fields X, Y, Z in FIG. 4, there are only 4 unique bit patterns. Hence there are 4 variables for table X ($x_1$, $x_2$, $x_3$, $x_4$), or 4 candidate bit patterns. In this scenario, all the fields in Instruction 1 are represented by the same variable $x_1$, since they all have the same bit pattern. The table X may have T entries.

The integer programming formulation for the N=1 case is then to find the values for $x_i$ that maximize the sum of the products:

Maximize: $x_1 x_1 x_1 + x_2 x_2 x_2 + x_1 x_2 x_3 + x_4 x_1 x_3$

Subject to the constraints:

$x_i$ (i=1 ... 4)=0 or 1

$\Sigma_{i=1...4} x_i \leq T$

Generalization:

In general, there may be N ($\geq 1$) tables in cache(s) 190. The $i^{th}$ table has $P_i$ candidate bit patterns found among the $M_i$ fields of all the instructions (e.g., all Q instructions). $M_1 + M_2 + \ldots + M_N = M$=Total number of compressible fields. The set of $M_i$ fields (and correspondingly the $i^{th}$ table) then has a set of $P_i$ variables, one for each candidate bit pattern.

Each instruction may be represented by a product of M variables, one from each compressible field. If M=N (as in the above example), each variable comes from a different set. The general integer programming formulation is to maximize the sum of all the products:

Maximize: $\Sigma_{j=1...Q} \Pi_{k=1...M} x(j,k)$ where x(j,k) is the variable for the bit pattern located in the $k^{th}$ field of the $j^{th}$ instruction. If the $k^{th}$ field's bit patterns are candidates to be stored into the $i^{th}$ table, the x(j,k) variable is from among the $P_i$ variables associated with the $i^{th}$ table.

The constraints on the above are given by:

x=0, 1 for all variables x from all the N tables; and $\Sigma_{k=1...Pi} x_k \leq T_i$ where $T_i$ is the number of entries in the $i^{th}$ table. That is, the maximum number of candidate bit patterns that may be inserted into any of the table is limited by the size of the table.

(B) Linear Integer Programming

A second approach for act 320 is to formulate this code compaction goal in the form of a linear integer programming problem. The parameters of the above example are again used to give the intuitive idea for act 320 with two different scenarios (i.e., M=N and N=1), before describing its generalization. Again, FIG. 4 may be discussed with 4 instructions, each with 3 compressible fields.

M=N Example:

As in the previous scheme, each bit-pattern-related variable receives a value 1 if and only if the bit pattern is compressed, otherwise it gets a value 0. In addition, there are 4 more variables ($w_1$, $w_2$, $w_3$, $w_4$), one for each instruction. Each instruction-related variable receives a value 0 if and only if the instruction is compressed; otherwise it gets a value 1. The sum $\Sigma_{j=1...4} w_j$ is minimized if and only the number of compressed instructions is maximized.

Constraint relationships may also be established between the instruction-related variables ($w_i$'s) and bit-pattern-related variables ($x_i$'s, $y_i$'s, $z_i$'s). For each instruction, if any of its fields' bit pattern is not compressed (i.e., the bit-pattern-related variable=0), then that instruction is not compressed (i.e., the instruction-related variable=1). For example, for the first instruction:

$w_1+x_1 \geq 1$, $w_1+y_1 \geq 1$, $w_1+z_1 \geq 1$

The linear integer programming formulation is to find the values for $w_i$ to minimize the sum:

Minimize: $w_1+w_2+w_3+w_4$

The constraints are:

$x_i$ (i=1 . . . 3)=0 or 1

$y_i$ (i=1,2)=0 or 1

$z_i$ (i=1 . . . 3)=0 or 1

$w_i$ (i=1 . . . 4)=0 or 1 and $w_1+x_1 \geq 1$, $w_1+y_1 \geq 1$, $w_1+z_1 \geq 1$ $w_2+x_2 \geq 1$, $w_2+y_2 \geq 1$, $w_2+z_2 \geq 1$ $w_3+x_1 \geq 1$, $w_3+y_2 \geq 1$, $w_3+z_3 \geq 1$ $w_4+x_3 \geq 1$, $w_4+y_1 \geq 1$, $w_4+z_3 \geq 1$ (i.e. an instruction is compressed when only all its fields are compressed)

and $\Sigma_{i=1...3} x_i \leq T_x$ $\Sigma_{i=1...2} y_i \leq T_y$ $\Sigma_{i=1...3} z_i \leq T_z$ (i.e. the number of compressed bit patters must fit into each corresponding table.)

N=1 Example:

If all fields share a single table (e.g., in cache 190), there are only 4 unique bit patterns. In addition to 4 variables ($x_1$, $x_2$, $x_3$, $x_4$) for the 4 candidate bit patterns, there are also 4 instruction-related variables ($w_1$, $w_2$, $w_3$, $w_4$). Further, the table X may have T entries.

The integer programming formulation is to find the values for $w_i$ which minimize the sum:

Minimize: $w_1+w_2+w_3+w_4$

Subject to the constraints $x_i$ (i=1 . . . 4)=0 or 1

$w_i$ (i=1 . . . 4)=0 or 1

$\Sigma_{i=1...4} x_i \leq T$, to limit number of selected candidates to size of table $w_1+x_1 \geq 1$, $w_1+x_1 \geq 1$, $w_1+x_1 \geq 1$ $w_2+x_2 \geq 1$, $w_2+x_2 \geq 1$, $w_2+x_2 \geq 1$ $w_3+x_1 \geq 1$, $w_3+x_2 \geq 1$, $w_3+x_3 \geq 1$ $w_4+x_4 \geq 1$, $w_4+x_1 \geq 1$, $w_4+x_3 \geq 1$ All the constraints above are listed for clarity, even though some of them are redundant.

Generalization:

In general, there may be N($\geq 1$) tables in cache(s) 190. The $i^{th}$ table has to choose among $P_i$ candidate bit patterns found among the $M_i$ fields of all the instructions (for example all Q instructions) to fit within its size. $M_1+M_2+...+M_N=M=$Total number of compressible fields. Each $i^{th}$ table then has a set of $P_i$ variables, one for each candidate bit pattern. There are also Q variables ($w_j$, j=1 . . . Q), one for each instruction. Each instruction generates a set of M constraints, one for each compressible field.

The general linear integer programming formulation is to find the values for $w_i$ which minimize the sum:

Minimize: $\Sigma_{j=1,...Q} w_j$

The constraints are given by:

x=0,1 for all variables x that correspond to the unique bit-patterns, $w_j$=0,1 for all the instruction-related variables, and $\Sigma_{k=1...Pi} x_k \leq T_i$ where $T_i$ is the number of entries in the $i^{th}$ table (i.e. the maximum number of candidate bit patterns we can insert into any of the table is limited by the size of the table).

In addition, for each $j^{th}$ instruction, there are M constraints:

$w_j+x(j,k) \geq 1$ (k=1, . . . M)

where x(j,k) is the variable for the bit pattern located in the $k^{th}$ field of the $j^{th}$ instruction. In conclusion, either the integer programming formulation or the linear integer programming formulation above may be automatically constructed by compactor 220 in act 320 from the unique bit patterns extracted in act 310.

Method 300 may continue with compactor 220 solving the linear or integer programming formulation [act 330]. The formulation or representation may be fed accordingly into any integer programming or linear programming solver. Such solvers are known and may generate an optimal solution that minimizes the linear or integer programming problem. The resulting solution for the variables in act 330 will identify those bit patterns to be compressed that will maximize the code compaction ratio.

Compactor 220 may compress the appropriate bit patterns in program based on the solution obtained in act 330 [act 340]. Several techniques for compressing instructions are described in the related application. When compressed in act 340 at compile time (or shortly thereafter), a program may be optimally compacted given the size constraints of cache(s) 190. As explained above, those unique bit patterns that are identified for compression in act 330 may be stored in cache (s) 190 in act 340, and their index may be inserted into the compressed instruction.

Method 300 may continue at execution time with second procession system 120 decompressing any compressed instructions while executing the program [act 350]. As stated above, not all instructions need to be compressed, although all may be if cache(s) 190 have sufficient storage. For those instruction that are not compressed, act 350 is inapplicable. For instructions that are compressed (e.g., 64 bits from 128 bits), in act 350 second processing system 120 may re-assemble the original, larger, instruction by retrieving the stored bit pattern(s) from cache(s) 190 based on index(es) in the compressed instruction. The decompressed instructions may be inserted into, for example, an execution pipeline by second processing system 120 in act 350.

The above-described scheme and system may advantageously and optimally compress a program (e.g., a kernel or other program), and it is independent of the specific integer programming or linear integer programming algorithm, or implementation. Such optimal program compression at compile-time may result in significant instruction footprint reduction through the compression to allow large, complex kernels to fit in instruction cache. A reduction in instruction code size may be equally effective as an increase in instruction cache size. Instruction compression may also reduce power and/or bandwidth requirements of instruction fetch (pipe, cache, etc).

The foregoing description of one or more implementations provides illustration and description, but it not intended to be exhaustive or to limit the scope of the invention to the precise from disclosed. Modifications and variations are possible in light of the above teachings or may be acquired from practice of various implementations of the invention.

For example, although linear and integer programming schemes have been described, any multivariate optimization scheme may be utilized to determine which bit patterns in compiled instructions to compress to obtain optimal program compaction.

No element, act, or instruction used in the description of the present application should be construed as critical or essential to the invention unless explicitly described as such. Also, as used herein, the article "a" is intended to include one or more items. Variations and modifications may be made to the above-described implementation(s) of the claimed invention without departing substantially from the spirit and principles of the invention. All such modifications and variations are intended to be included herein within the scope of this disclosure and protected by the following claims.

What is claimed:

1. A method of compressing instructions in a program, comprising:

using a processor, coupled to a memory, to compile the program to produce binary data;
   extracting unique patterns of bits from the binary data;
   constructing a linear programming formulation or an integer programming problem based on the unique patterns of bits and a storage capacity for the unique patterns of bits that when solved will produce an optimum compression of the program for the storage capacity;
   solving the linear programming formulation or the integer programming problem to produce a solution, and
   compressing at least some of the instructions in the program based on the solution.

2. The method of claim 1, wherein the constructing includes:
   mapping the unique patterns of bits into variables in the linear programming formulation or the integer programming problem.

3. The method of claim 1, wherein the integer programming problem includes a linear integer programming problem.

4. The method of claim 1, wherein the solution specifies designated unique patterns that are to be used in the compressing, and
   wherein the compressing includes storing the designated unique patterns in the storage capacity within a memory.

5. The method of claim 1, further comprising:
   decompressing compressed instructions before execution of the compressed instructions.

6. The method of claim 5, wherein the compiling, extracting, constructing, solving, and compressing are performed by a first processing system, and
   wherein the decompressing is performed by a second processing system.

7. A system to compress a program, comprising:
   a compiler to translate the program to a binary format;
   a memory to store binary data, the memory having a capacity; and
   a compactor connected to the compiler and the memory to extract unique bit patterns from the binary format of the program and to optimally compress the program based on the capacity of the memory and on the unique bit patterns by storing at least some of the unique bit patterns in the memory and inserting corresponding indices into the program.

8. The system of claim 7, further comprising:
   a processing system connected to the memory and the compactor to execute the optimally compressed program.

9. The system of claim 8, wherein the processing system is arranged to decompress the optimally compressed by retrieving the at least some of the unique bit patterns from the memory using the corresponding indices.

10. The system of claim 7, wherein the compactor is arranged to formulate and solve an integer programming problem to optimally compress the program.

11. The system of claim 10, wherein the compactor is further arranged to map the unique bit patterns to variable when formulating the integer programming problem.

12. The system of claim 10, wherein the integer programming problem is a linear integer programming problem.

* * * * *